(12) United States Patent
Heidorn et al.

(10) Patent No.: US 6,731,489 B2
(45) Date of Patent: May 4, 2004

(54) 5-PIN PROTECTOR

(75) Inventors: Richard H. Heidorn, Huntley, IL (US); Mohammad Masghati, Carol Stream, IL (US)

(73) Assignee: Illinois Tool Works Inc., Glenview, IL (US)

(*) Notice: Subject to any disclaimer, the term of this patent is extended or adjusted under 35 U.S.C. 154(b) by 0 days.

(21) Appl. No.: 10/227,904

(22) Filed: Aug. 26, 2002

(65) Prior Publication Data

US 2004/0037021 A1 Feb. 26, 2004

(51) Int. Cl.$^7$ ................................................ H02H 9/06
(52) U.S. Cl. .................. 361/119; 361/117; 361/127; 361/736; 361/126
(58) Field of Search .......................... 361/54, 56, 57, 361/103–104, 117, 118, 119, 127, 124, 730, 736, 748, 760, 719

(56) References Cited

U.S. PATENT DOCUMENTS

| | | | | |
|---|---|---|---|---|
| 5,034,846 A | * | 7/1991 | Hodge et al. | |
| 5,483,409 A | * | 1/1996 | Heidorn et al. | |
| 5,706,160 A | * | 1/1998 | Latuszkin et al. | |
| 5,841,620 A | * | 11/1998 | Masghati | |
| 6,084,761 A | * | 7/2000 | Casey et al. | |

\* cited by examiner

*Primary Examiner*—Dean A. Reichard
*Assistant Examiner*—Nguyen T. Ha
(74) *Attorney, Agent, or Firm*—Mark W. Croll; Paul F. Donovan

(57) ABSTRACT

A Category 5 (as well as newer revisions, such as Category 6 and Category E)/single-pair surge protector module for protecting telecommunications related equipment and the like from transient voltage and current surges includes a two-piece interfitting housing which receives a miniature printed circuit board therein. The miniature printed circuit board is used to mount a Category 5 (as well as newer revisions, such as Category 6 and Category E)/circuit surge protector device. The surge protector device includes a pair of voltage suppressors and four banks of diodes.

17 Claims, 2 Drawing Sheets

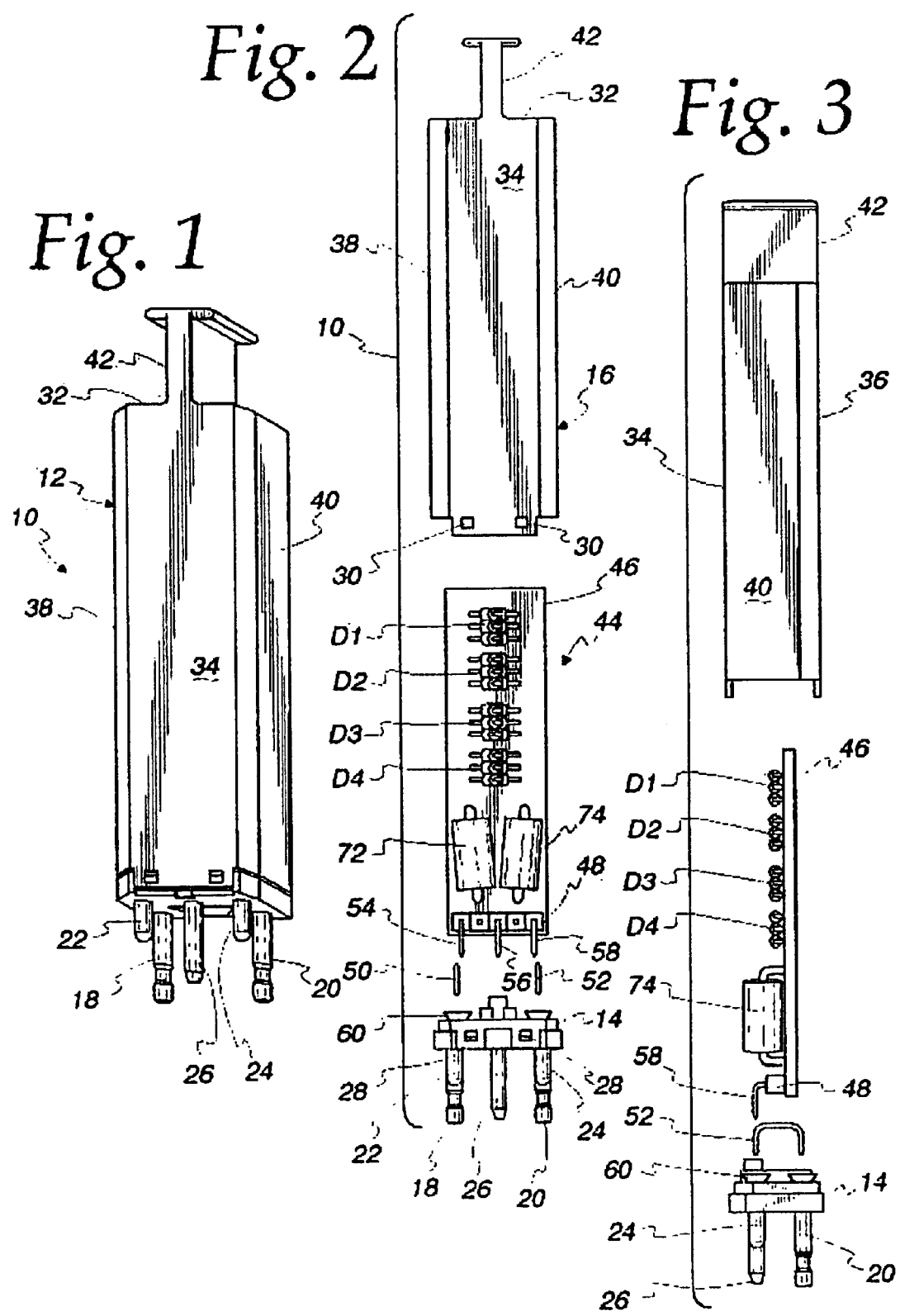

5-PIN PROTECTOR

BACKGROUND OF THE INVENTION

This invention relates generally to surge protection devices for protecting telecommunications related equipment from power and transient surges. More particularly, it relates to an improved 5-pin surge protector module formed of a two-piece interfitting housing which receives a single miniature printed circuit board for mounting a Category 5 (as well as newer revisions, such as Category 6 and Category E)/circuit surge protector device so as to protect a single pair of telephone lines against transient voltage and current surges.

As is generally well-known to those skilled in the telecommunications industry, modern telecommunications equipment is susceptible to transient surges such as those caused by lightning strikes and other surges on the transmission lines. Thus, various arrangements of surge protector circuits are known in the prior art which have been provided for connecting to each pair of incoming telephone lines so as to be normally non-conductive but are rendered conductive when a high voltage surge exceeds a predetermined breakdown voltage (e.g., 250 V) for protecting the equipment. Each pair of incoming telephone lines includes a "tip" line and a "ring" line. Each of the tip and ring lines is typically connected to a conventional 5-pin surge protector module via a protector block. One of the five pins is connected to an incoming tip line. A second one of the five pins is connected to an incoming ring line. A third one of the five pins is connected to an outgoing tip line. A fourth one of the five pins is connected to an outgoing ring line. A fifth one is connected to a ground potential. However, the conventional 5-pin surge protector module does not meet the current Telecommunication Industry Association (TIA) for Category 5 specification (TIA/EIA Standard 568A).

There is also known in the prior art of a circuit protection assembly for protecting telecommunications related equipment having up to 25-pairs of wires from transient voltage/current surges and also meets the TIA specification for Category 5. Such a Category 5/25-pair circuit protection assembly of the prior art is described and illustrated in U.S. Pat. No. 6,134,093 to M. Masghati issued on Oct. 17, 2000 and assigned to the same assignee as the present invention. However, there has not been available heretofore to the knowledge of the inventors of a Category 5 (as well as newer revisions, such as Category 6 and Category E)/5-pin surge protector module for protecting only a single pair of telephone lines.

Accordingly, it would be desirable to provide an improved 5-pin surge protector module for protecting only a single pair of telephone lines and yet still meets the TIA specification for Category 5 (as well as newer revisions, such as Category 6 and Category E). Therefore, the inventors of the present invention have developed such an improved Category 5 (as well as newer revisions, such as Category 6 and Category E)/5-pin surge protector module.

SUMMARY OF THE INVENTION

Accordingly, it is a general object of the present invention to provide an improved 5-pin surge protector module which is relatively simple and economical to manufacture and assembly but has been traditionally unavailable.

It is an object of the present invention to provide an improved Category 5 (as well as newer revisions, such as Category 6 and Category E)/5-pin surge protector module for protecting only a single pair of telephone lines.

It is another object of the present invention to provide an improved 5-pin surge protector module formed of a two-piece interfitting housing which receives a single miniature printed circuit board for mounting a Category 5 (as well as newer revisions, such as Category 6 and Category E)/circuit surge protector device.

In a preferred embodiment of the present invention, there is provided a circuit surge protector module for protecting telecommunications related equipment and the like from transient voltage and current surges which includes a housing formed of a co-mating base member and a cover member. The cover member has a top wall, a front wall, a rear wall, and opposed side walls all formed integrally together. Input tip and ring pins, output tip and ring pins and a ground pin extend outwardly from the base member. A printed circuit board sub-assembly includes a miniature printed circuit board, a header formed on one end of the printed circuit board and jumper wires. The miniature printed circuit board is fixedly joined to the base member via the header and the jumper wires. A circuit surge protector device is mounted on the miniature printed circuit board. The surge protector device includes voltage suppressors and four banks of diodes.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein:

FIG. 1 is a perspective view of a Category 5 (as well as newer revisions, such as Category 6 and Category E)/single-pair surge protector module, constructed in accordance with the principles of the present invention;

FIG. 2 is an exploded plan view of the surge protector module of FIG. 1;

FIG. 3 is an exploded side view of the surge protector module of FIG. 1;

DESCRIPTION OF THE PREFERRED EMBODIMENT

Figure 4:
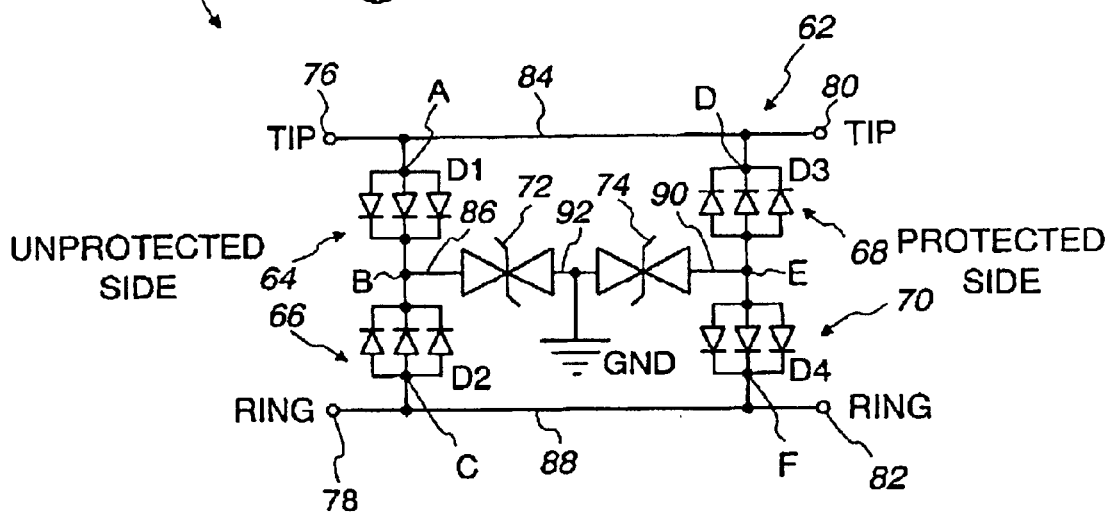
FIG. 4 is a schematic circuit diagram of the Category 5 (as well as newer revisions, such as Category 6 and Category E)/circuit surge protector device of FIG. 2 or FIG. 3.

It is to be distinctly understood at the outset that the present invention shown in the drawings and described in detail in conjunction with the preferred embodiment is not intended to serve as a limitation upon the scope or teachings thereof, but is to be considered merely as an exemplification of the principles of the present invention.

Referring now in detail to the various views of the drawings, there is shown in FIGS. 1 through 5 an improved Category 5 (as well as newer revisions, such as Category 6 and Category E)/single-pair surge protector module 10 which is constructed in accordance with the principles of the present invention. The surge protector module 10 suitably fits into a conventional protector block (not shown) in common use in telephone communications related equipment and other electronic applications. The improved Category 5 (as well as newer revisions, such as Category 6 and Category E)/surge protector module 10 is utilized to protect sensitive communications equipment coupled to a single pair of telephone lines from transient voltage/current surges but yet still meets the TIA specification for Category 5 (as well as newer revisions, such as Category 6 and Category E).

The surge protector module 10 includes a two-piece, molded interfitting housing 12 made of a suitable plastic material such as polycarbonate and the like which is comprised of a base member 14 and a co-mating cover member 16. The base member 14 receives and positions input tip and ring pins 18, 20; output tip and ring pins 22, 24; and a ground pin 26 all arranged in a conventional configuration. Each of the pins 18–26 extends outwardly through corresponding openings (not shown) formed in the base member 14. The base member 14 is provided with a plurality of tabs 28 which can be received and retained in corresponding apertures 30 formed in the cover member 16. In this manner, the base member 14 can be secured to and interlocks with the cover member 16 through a snap-fit engagement.

The cover member 16 has a generally rectangular configuration and includes a top wall 32, a front wall 34, a rear wall 36, and opposed side walls 38, 40, all formed integrally together. The top wall 32 is provided with a handle portion 42 which can be gripped by a user to facilitate insertion and removal of the surge protector module 10 from the protector block. The cover member 16 is open at its bottom end for receiving and enclosing a printed circuit board sub-assembly 44.

The printed circuit board sub-assembly 44 includes a miniature printed circuit board 46, a right-angled header 48, and a pair of 22-AWG jumper wires 50, 52. The right-angled header 48 is formed on one end of the printed circuit; board 46 and is. designed for plug-in assembly via its pins 54, 56 and 58 into associated cup or socket portions 60 of the output tip pin 22, ground pin 26, and output ring pin 24, respectively. Further, it will be noted that the jumper wire 50 is used to effect electrical connection between the input tip pin 18 and the output tip pin 22. The jumper wire 52 is used to effect electrical connection between the input ring pin 20 and the output ring pin 24. During assembly, each of the cup portion 60 with the header pins 54–58 and/or jumper wires 50, 52 inserted therein are filled with solder so as to fixedly join the printed circuit board 46 to the base member 14. The miniature printed circuit board 46 has mounted thereon a single-pair/circuit surge protector device 62 which meets the TIA specification for Category 5 (as well as newer revisions, such as Category 6 and Category E).

Figure 5:
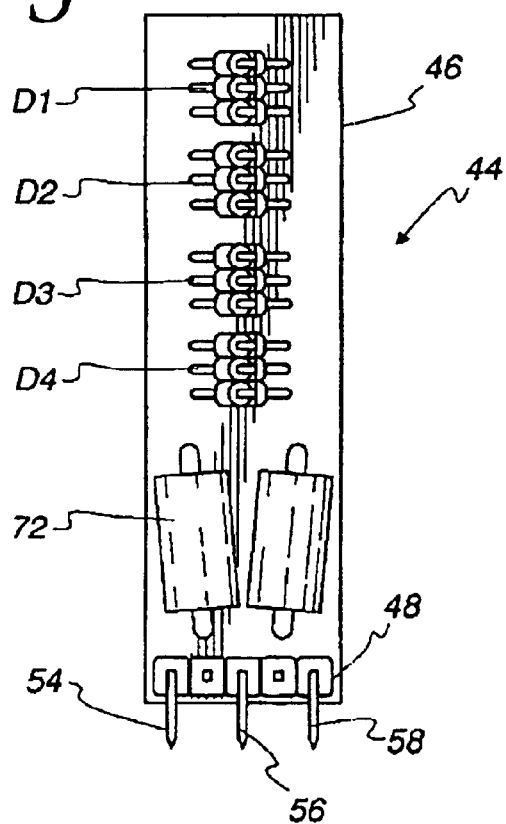
FIG. 5 is an enlarged view of the miniature printed circuit board of FIG. 2, with a Category 5 (as well as newer revisions, such as Category 6 and Category E)/circuit surge protector device mounted thereon.

As can best be seen from FIGS. 4 and 5, the circuit surge protector device 62 is comprised of four banks 64, 66, 68 and 70 of rectifier diodes and a pair of voltage suppressors 72, 74. The input or unprotected side of the surge protector device 62 is connectable between a single pair of incoming telephone lines applied across an input tip terminal 76 via the input tip pin 18 and an input ring terminal 78 via the input ring pin 20. The output or protected side of the surge protector device 62 is connectable between two wires of individual telephone equipment to be protected applied across an output tip terminal 80 via the output tip pin 22 and an output ring terminal 82 via the output ring pin 24.

Each of the four banks 64–70 of diodes is comprised of three (3) low capacitance diodes connected in parallel. The first bank 64 is formed of three diodes D1 connected in parallel with their common anodes connected together at node A and further joined to a first conductor lead 84. The common cathodes of the diodes D1 are also connected together at node B and further joined to a second conductor lead 86. The second bank 66 is formed of three diodes D2 connected in parallel with their common anodes connected together at node C and further joined to a third conductor lead 88. The common cathodes of the diodes D2 are also connected together at the node B and to the second conductor lead 86.

Similarly, the third bank 68 is formed of three diodes D3 connected in parallel with their common cathodes connected together at node D and further joined to the first conductor lead 84. The common anodes of the diodes D3 are also connected together at node E and further joined to a fourth conductor lead 90. The fourth bank 70 is formed of three diodes D4 connected in parallel with their common cathodes connected together at node F and further joined to the third conductor lead 88. The common anodes of the diodes D4 are also connected together at the node E and to the fourth conductor lead 90. Each of the diodes D1 through D4 in their respective banks 64–70 can be similar to the type BAV21 which has a low capacitance.

The first voltage suppressor 72 has its one end connected to the second conductor lead 86 and its other end connected to a ground source GND via a ground conductor lead 92. Similarly, the second voltage suppressor 74 has its one end connected to the fourth conductor lead 90 and its other end connected also to the ground conductor lead 92. Each of the voltage suppressors 72 and 74 may be formed of a silicon avalanche suppressor (SAS), sidactor, gas tube, or Zener diode. In this preferred embodiment, the voltage suppressors 72 and 74 are formed by silicon avalanche suppressors similar to the type 1.5 KE18CA.

From the foregoing detailed description, it can thus be seen that the present invention provides a Category 5 (as well as newer revisions, such as Category 6 and Category E)/single-pair surge protector module for protecting telephone communication related equipment and the like from transient voltage and current surges which includes a two-piece interfitting housing for receiving a miniature printed circuit board therein. The miniature printed circuit board is used to mount a Category 5 (as well as newer revisions, such as Category 6 and Category E)/circuit surge protector device. The surge protector device includes a pair of voltage suppressors and four banks of diodes.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

What is claimed is:

1. A surge protector module for protecting telecommunications related equipment and the like from transient voltage and current surges, comprising:

a housing formed of a co-mating base member and a cover member, said cover member including a top wall, a front wall, a rear wall, and opposed side walls all formed integrally together;

input tip and ring pins, output tip and ring pins and a ground pin extending outwardly from said base member;

a printed circuit board sub-assembly including a miniature printed circuit board, a header formed on one end of said printed circuit board, and jumper wires, said miniature printed circuit board being fixedly joined to said base member via said header and said jumper wires;

a circuit surge protector device being mounted on said miniature printed circuit board; and said surge protector device including voltage suppressor means and four banks of diode means.

2. A surge protector module as claimed in claim 1, wherein each of said four banks of diode means includes three diodes connected in parallel and said voltage suppressor means includes a pair of voltage suppressors.

3. A surge protector module as claimed in claim 2, wherein each of said diodes in said four banks of diode means has a low capacitance.

4. A surge protector module as claimed in claim 1, wherein said housing is formed of a generally rectangular shape.

5. A surge protector module as claimed in claim 1, wherein said housing is formed of a plastic material.

6. A surge protector module as claimed in claim 5, wherein said housing is made of a polycarbonate material.

7. A surge protector module as claimed in claim 2, wherein said pair of voltage suppressors is comprised of silicon avalanche suppressors.

8. A surge protector module as claimed in claim 1, further comprising a handle portion being formed on the top wall of said housing to facilitate insertion and removal of said surge protector module from a protector block.

9. A surge protector module as claimed in claim 1, wherein each of said input tip and ring pins, said output tip and ring pins and said ground pin is formed with a cup portion which is filled with solder so as to fixedly join said miniature printed circuit board to said base member.

10. A surge protector module for protecting telecommunications related equipment and the like from transient voltage and current surges, comprising:

housing means formed of a co-mating base member and a cover member;

miniature printed circuit board means disposed within said housing means;

circuit surge protector means being mounted on said miniature printed circuit board means; and said surge protector means includes voltage suppressor means and four banks of diode means; and said miniature printed circuit board means including a miniature printed board, a header formed on one end of said miniature printed circuit board, and jumper wires, said miniature printed circuit board being fixedly joined to said base member via said header and said jumper wires.

11. A surge protector module as claimed in claim 10, wherein each of said four banks of diode means includes three diodes connected in parallel and said voltage suppressor means includes a pair of voltage suppressors.

12. A surge protector module as claimed in claim 11, wherein each of said diodes in said four banks of diode means has a low capacitance.

13. A surge protector module as claimed in claim 10, wherein said housing means is formed of a generally rectangular shape.

14. A surge protector module as claimed in claim 10, wherein said housing means is formed of a plastic material.

15. A surge protector module as claimed in claim 14, wherein said housing means is made of a polycarbonate material.

16. A surge protector module as claimed in claim 11, wherein said pair of voltage suppressors is comprised of silicon avalanche suppressors.

17. A surge protector module as claimed in claim 10, further comprising handle means being formed on said housing means to facilitate insertion and removal of said surge protector module from a protector block.

* * * * *